United States Patent
Yang et al.

(10) Patent No.: US 10,568,233 B2
(45) Date of Patent: Feb. 18, 2020

(54) THERMALLY CONDUCTIVE SUBSTRATE ARTICLE

(71) Applicant: 3M INNOVATIVE PROPERTIES COMPANY, St. Paul, MN (US)

(72) Inventors: Rui Yang, Austin, TX (US); Hui Luo, Woodbury, MN (US); Carl E. Fisher, Austin, TX (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 103 days.

(21) Appl. No.: 14/391,459

(22) PCT Filed: Mar. 7, 2013

(86) PCT No.: PCT/US2013/029571
§ 371 (c)(1),
(2) Date: Oct. 9, 2014

(87) PCT Pub. No.: WO2014/003835
PCT Pub. Date: Jan. 3, 2014

(65) Prior Publication Data
US 2015/0111021 A1    Apr. 23, 2015

Related U.S. Application Data

(60) Provisional application No. 61/665,524, filed on Jun. 28, 2012.

(51) Int. Cl.
*H05K 7/20* (2006.01)
*B32B 27/38* (2006.01)
(Continued)

(52) U.S. Cl.
CPC .............. *H05K 7/20* (2013.01); *B32B 5/022* (2013.01); *B32B 15/14* (2013.01); *B32B 27/38* (2013.01);
(Continued)

(58) Field of Classification Search
CPC ......... H01L 2924/00; H01L 2924/0002; H01L 2924/00014; H05K 1/162; H05K 1/0373;
(Continued)

(56) References Cited

U.S. PATENT DOCUMENTS 3,878,316 A * 4/1975 Groff .................. H05K 1/0366
174/258
3,936,575 A   2/1976 Watanabe
(Continued)

FOREIGN PATENT DOCUMENTS

CN    101415295    4/2009
EP    0340737    11/1989
(Continued)

OTHER PUBLICATIONS

Li, Xin-Gui and Mei-Rong Huang. Thermal Degradation of Kevlar Fiber by High-Resolution Thermogravimetry. Jan. 24, 1999. Journal of Applied Polymer Science. Wiley Online Library. vol. 71, Issue 4, pp. 565-571.*

(Continued)

*Primary Examiner* — Maria V Ewald
*Assistant Examiner* — Ethan Weydemeyer
(74) *Attorney, Agent, or Firm* — Clifton F. Richardson (57) ABSTRACT

A thermally conductive article including a polymeric layer comprising a nonwoven polymeric material. In particular, a flexible thermally conductive polymeric layer comprising an epoxy resin and a long-strand polymeric nonwoven material embedded in the epoxy resin. The polymeric nonwoven material may be heat stable at about 280 C.

20 Claims, 1 Drawing Sheet (51) Int. Cl.
  *B32B 15/14* (2006.01)
  *B32B 5/02* (2006.01)
(52) U.S. Cl.
  CPC ..... *B32B 2250/40* (2013.01); *B32B 2260/046* (2013.01); *B32B 2307/302* (2013.01); *B32B 2457/00* (2013.01); *Y10T 442/2861* (2015.04); *Y10T 442/656* (2015.04)
(58) Field of Classification Search
  CPC ... H05K 2201/0209; H05K 2201/0257; H05K 2201/0278; Y10T 29/435; Y10T 29/49155; Y10T 428/24917
  USPC .......... 29/846–853; 174/68.1–268; 204/192.35–192.36; 216/13–21; 257/E23.06–E23.077; 438/238–256; 428/220; 442/164, 378
  See application file for complete search history.

(56) References Cited

U.S. PATENT DOCUMENTS

| | | | |
|---|---|---|---|
| 3,948,811 | A | 4/1976 | Clary |
| 4,684,678 | A | 8/1987 | Schultz |
| 4,897,301 | A | 1/1990 | Uno |
| 4,994,316 | A | 2/1991 | Browne |
| 5,024,858 | A * | 6/1991 | Burch .................. D06M 11/83 427/123 |
| 5,049,435 | A | 9/1991 | Uno |
| 5,498,471 | A | 3/1996 | Hausdorf |
| 5,604,026 | A | 2/1997 | King |
| 6,274,224 | B1 | 8/2001 | O'Bryan |
| 6,403,211 | B1 | 6/2002 | Yang |
| 6,611,046 | B2 | 8/2003 | Yang |
| 6,638,378 | B2 | 10/2003 | O'Bryan |
| 6,645,630 | B1 | 11/2003 | Nakamura |
| 7,192,634 | B2 | 3/2007 | Carter et al. |
| 7,292,440 | B2 | 11/2007 | Cho |
| 7,348,045 | B2 | 3/2008 | Yang |
| 7,399,919 | B2 | 7/2008 | McCutcheon |
| 2002/0001720 | A1 | 1/2002 | Clough |
| 2003/0087077 | A1 | 5/2003 | Samuels |
| 2003/0091777 | A1 | 5/2003 | Jones |
| 2006/0258241 | A1 | 11/2006 | Roseen, Jr. et al. |
| 2008/0053695 | A1 | 3/2008 | Choi |
| 2008/0064279 | A1 | 3/2008 | Browning |
| 2009/0142567 | A1 * | 6/2009 | Kanakarajan ............. B32B 5/26 428/220 |
| 2009/0246521 | A1 | 10/2009 | Swift |
| 2009/0268928 | A1 | 10/2009 | Ikeyama |
| 2010/0108367 | A1 | 5/2010 | Furushita |
| 2010/0279566 | A1 | 11/2010 | Yang |
| 2012/0295052 | A1 | 11/2012 | Choi |
| 2013/0118773 | A1 | 5/2013 | Liu |

FOREIGN PATENT DOCUMENTS

| | | | | |
|---|---|---|---|---|
| EP | 0882574 | 12/1998 | | |
| JP | H01-271235 | 10/1989 | | |
| JP | H04-250683 | 9/1992 | | |
| JP | 2002-226718 | 8/2002 | | |
| JP | 2003-031913 | 1/2003 | | |
| JP | 2003-206360 | 7/2003 | | |
| JP | 2003-213019 | 7/2003 | | |
| JP | 2004-002653 | 1/2004 | | |
| JP | 2004-241647 | 8/2004 | | |
| JP | 2006-200066 | 8/2006 | | |
| JP | 2006/200066 A | * | 8/2006 | ............ D21H 13/26 |
| JP | 2006200066 A | * | 8/2006 | ............ D21H 13/26 |
| JP | 2010-000774 | 1/2010 | | |
| WO | WO 2009-142192 | 11/2009 | | |
| WO | WO 2013-062836 | 5/2013 | | |
| WO | WO 2014-003835 | 1/2014 | | |

OTHER PUBLICATIONS

"CooLam thermal substrates", Dupont, [retrieved form the internet on Mar. 5, 2013], URL <http://www2.dupont.com/LED_Lighting/en_US/products/coolam/coolam.html>, pp. 2.

"ECOOL-F", Panasonic corporation, [retrieved form the internet on Mar. 5, 2013], URL <http://www3.panasonic.biz/em/pcbm/en/product/ecooVecool-F.html>, 2012, pp. 2.

"Melt Blown Technology", [retrieved form the internet on Jun. 5, 2012] <http://www.engr.utk.edu/mse/Textiles/Melt%20Blown%20Technology.htm>, 2004, pp. 14.

"Non-woven Fabrics and Non-woven Fabric Raw Materials", Kuraray, [retrieved form the internet on Apr. 27, 2012], URL <http://www.kuraray.co.jp/en/company/business/fibers_02.html>, pp. 2.

"T-Clad overview—Thermal Substrates, Thermal Interface Material", The Bergquist Company, [retrieved form the internet on Mar. 5, 2013], URL < http://www.bergquistcompany.com/thermal_substrates/t-clad-product-overview.htm>, pp. 3.

"VECRUS Liquid Crystal Polymer Non-Woven Fabric", Kuraray, [retrieved form the internet on Apr. 27, 2012], <http://www.kuraray.co.jp/en/products/medical/vecls.html>, pp. 1.

Grafe, "Polymeric Nanofibers and Nanofiber Webs: A New Class of Nonwovens", presented at INTC 2002: International Nonwovens Technical Conference, 2002, 14pgs.

International Search Report for PCT International Application No. PCT/US2013/029571, dated Jun. 27, 2013, 4pgs.

* cited by examiner

THERMALLY CONDUCTIVE SUBSTRATE ARTICLE

TECHNICAL FIELD

This invention relates to thermally conductive substrate articles. In particular it relates to thermally conductive layers in electrical or electronic articles.

BACKGROUND

Various electrical and electronic applications require the removal of heat, or the transfer of heat away, from a particular device or location. Thermally conductive articles are useful in such applications. One such application is a flexible printed circuit used in light emitting diode (LED) devices. Flexible printed circuits typically include a polymeric layer often clad on one or both sides with a conductive layer. LEDs may be located on a conductive or polymeric layer of a flexible printed circuit. Dissipating and removing heat generated by the LEDs is an issue with any LED device.

SUMMARY

To address the heat removal issues associated with various devices such as LED devices, embodiments of the present invention provide a thin, strong, flexible polymeric layer, which may be used to form, e.g., a thin, strong, flexible printed circuit. The thin polymeric layer helps to minimize the barrier to heat transfer, for example from the LEDs on one side of the polymeric layer to a thermally conductive layer on the opposite side of the polymeric layer. In at least one embodiment, the polymeric layer includes thermally conductive filler, which further assists in the transfer of heat through the polymeric layer.

In some instances, it may be desirable to have a thin, strong, flexible polymeric layer that is electrically conductive as well as thermally conductive. In at least one embodiment, the polymeric layer includes electrically conductive filler, which may also be thermally conductive.

In some instances, it may be desirable to have a polymeric layer that can survive a lead-free solder flow process, which may subject the polymeric layer to temperatures greater than about 280° C. for at least 90 seconds.

One embodiment of the present invention features an article comprising a flexible thermally conductive polymeric layer comprising an epoxy resin and a long-strand polymeric nonwoven material embedded in the epoxy resin. In at least one embodiment, the polymeric nonwoven material can withstand, without melting and preferably without any property changes, temperatures of at least about 280° C. for at least 90 seconds.

An advantage of at least one embodiment of the present invention is that it has an electrical resistance of about 1 ohm or less.

An advantage of at least one embodiment of the present invention is that it is suitable as a means to ground electrical or electronic components as well as dissipate heat.

An advantage of at least one embodiment of the present invention is that it is suitable for static discharge dissipation.

An advantage of at least one embodiment of the present invention is that it provides a strong, flexible polymeric layer suitable for use in a copper-clad laminate structure that is subjected to a double-sided copper patterning etch process. Being able to etch both copper layers at the same time, rather than one at a time, enables a process cost reduction.

Another advantage of at least one embodiment of the present invention is that the presence of the nonwoven material allows for a thinner polymeric layer because the nonwoven material's strength enables the polymeric layer to be self-supporting even if the epoxy coating is thin.

In this application:

"self-supporting" refers to a film, sheet or layer of material having sufficient structural integrity such that it is capable of being handled and/or subjected to standard manufacturing processes without a separate supporting layer;

"long-strand nonwoven material" means a nonwoven material in which the average length of the strands is equal to or greater than about 100 µm;

"high temperature" means having a melt temperature greater than about 280° C., preferably greater than about 300° C., more preferably greater than about 320° C., and most preferably greater than about 330° C.

Other features and advantages of the invention will be apparent from the following drawings, detailed description, and claims.

DETAILED DESCRIPTION

At least one embodiment of the present invention provides a polymeric layer comprising an epoxy-coated nonwoven polymeric material in which the nonwoven material is essentially embedded in the epoxy resin. Embodiments of the polymeric layers of the present invention may be suitable for use in a variety of electrical and electronic applications in which it is desirable to have a flexible, self-supporting, thermally (and optionally electrically) conductive layer. For example, embodiments of polymeric layers of the present invention may be suitable for use in one metal layer or two metal layer (i.e., two-sided) flexible printed circuits. Embodiments of the polymeric layer alone and embodiments of flexible printed circuits of the present invention may be suitable for use in LED devices as well as other applications.

To create the epoxy-coated nonwoven polymeric material, an epoxy resin composition may be coated onto a nonwoven material. Suitable epoxy resin compositions may be made from thermally curable epoxy resins. The term epoxy resin composition will typically be used to refer to an uncured composition. An exemplary epoxy resin composition includes one or more aromatic polyepoxides and one or more 9,9-bis(aminophenyl)fluorene curing agents. Suitable aromatic polyepoxides include poly(glycidyl ether)s of polyhydric phenols and epoxy resins available from Shell Chemical Company, Houston, Tex., under the trade designations EPON 1001F and EPON 1050. Other suitable resins include blends of a diglycidylether of bisphenol A and a novolac epoxy, for example, 75 to 90% by weight EPON 1001F and 25 to 10% by weight EPON 1050F based on the total weight of the resin. Suitable curing agents for the epoxy resin compositions include, but are not limited to, di(4-aminophenyl)sulfone and 9,9-bis(aminophenyl)fluorene as described in U.S. Pat. No. 4,684,678.

The epoxy may be cured upon applying it to the nonwoven material, but may also remain in an uncured state. It may then later be cured, for example, when it is incorporated into a structure or device. Curing the epoxy will typically cause it to adhere to adjacent materials.

In at least one embodiment of the present invention, the epoxy resin of the polymeric layer is loaded with thermally conductive particles to increase the thermal conductivity of the polymeric layer. Suitable thermally conductive particles include but are not limited to aluminum oxide, aluminum nitride, aluminum hydroxide, and boron nitride. In at least one embodiment, the thermally conductive particles have a thermal conductivity greater than 10 W/m·K.

The type and amount of thermally conductive particle added to the epoxy will influence the thermal conductivity of the resulting polymeric layer. In some embodiments, the thermal conductivity of the polymeric material of at least some embodiments of the present invention is greater than about 0.5 W/m·K, preferably greater than about 1.0 W/m·K, more preferably greater than about 1.3 W/m·K, and most preferably greater than about 1.6 W/m·K.

In at least one embodiment of the present invention, the epoxy resin of the layer is loaded with electrically conductive particles to provide electrical conductivity. In most cases the electrically conductive particles are also thermally conductive and will increase the thermal conductivity of the layer. Non-limiting examples of suitable electrically conductive particles include but are not limited to various types of carbon such as carbon particles, e.g., carbon black, carbon nanotubes, graphene, and the like; metals and metallic powders such as copper, aluminum, gold, silver, chromium, palladium, nickel, and alloys thereof; insulating particles having conductive coatings such as metal (or metal alloy)-coated glass beads, e.g., silver-coated glass beads, and the like. In at least one embodiment of the present invention, the epoxy resin of the polymeric layer is loaded with both thermally conductive particles and electrically conductive particles.

The type and amount of electrically conductive particle added to the epoxy will influence the conductivity and resistance of the resulting polymeric layer. In some embodiments, for example those having silver-coated glass beads, the electrical resistance is 1 ohm or less. These embodiments may be well-suited for applications in which a highly conductive material is needed. In some embodiments, for example those having carbon particles, the electrical resistance is about 100 ohms or less. These embodiments may be well-suited for applications in which a highly conductive material is not desired. For example, a substrate carrying electronic components preferably has some amount of conductivity so as to dissipate static conductive charges, but not enough conductivity that a charge would be transmitted to the electronic device.

In at least one embodiment of the present invention the thermally and/or electrically conductive particles comprise up to about 75 wt % of the epoxy. The shape (which can affect the particles' ability to flow during processing) and density of the particles influence the preferred wt % for any given embodiment.

The particles may be any shape and may be regularly or irregularly shaped. Exemplary shapes include spheres, platelets, cubes, needles, oblate, spheroids, pyramids, prisms, flakes, rods, plates, fibers, chips, whiskers, and mixtures thereof. A suitable particle size, e.g., diameter or maximum dimension (i.e., the largest dimension for any particular shape, e.g., length, width, thickness), may have a lower range of about 100 nm to about 500 nm and an upper range of about 2 micrometer ($\mu$m) to about 20 $\mu$m. In at least one embodiment, spherical particles have a diameter of about 0.5 to about 3 $\mu$m. In at least one embodiment, spherical particles have a mean diameter ranging from about 0.5 to about 3 $\mu$m. In at least one embodiment, particles have a maximum dimension of about 0.5 to about 20 $\mu$m. In at least some embodiments it is preferred to have a range of particle sizes because more particles can be added than if just larger size particles were used. Typically, the particles have a size allowing at least two to three particles to be stacked vertically within the polymeric layer thickness.

In general, it is known that to achieve a resin-based layer having a high thermal conductivity, high loading levels of thermally conductive particles may be needed. However, this can make the resin-based material very brittle. If it is brittle, the resin-based layer cannot endure being processed as a self-supporting layer. For example, for a two metal layer structure, if the resin-based layer is brittle and both metal layers are to be pattern etched, it is necessary to etch only one layer at a time so that the resin-based layer is always supported on at least on one side. For example, after the first metal layer is etched, a supporting layer is applied over the etched metal layer, then the other metal layer is etched.

Figure 1:
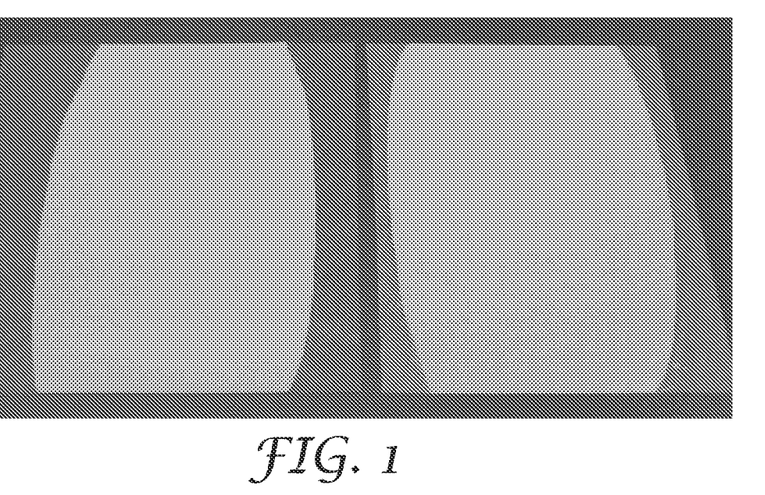
FIGS. 1 to 3 are digital images of a polymeric layer of the present invention (right side) and a comparative sample (left side), showing the effect on the samples of being bent to 180°.
Figure 2:
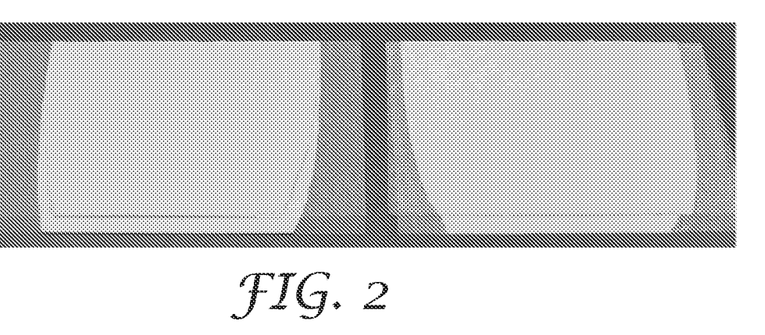
Figure 3:
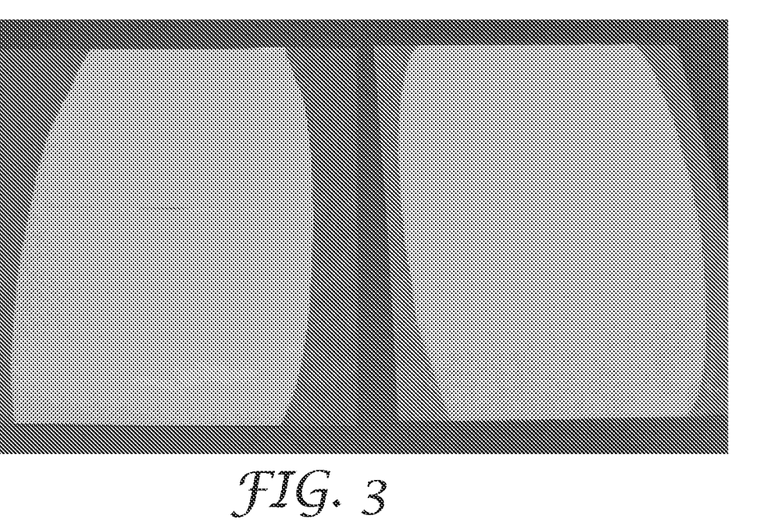

Embodiments of the present invention overcome the brittleness issue by adding a polymeric nonwoven material to a resin-based layer, which improves the strength of the resulting layer. At least one embodiment of the present invention provides a flexible and robust polymeric layer. Even if the nonwoven material and epoxy, each by themselves, are not self-supporting, when combined they can create a self-supporting layer. The strength and flexibility of at least some embodiments of the present invention as compared to an epoxy-coated glass fiber polymeric layer is shown in FIGS. 1 to 3. FIG. 1 shows side by side examples of a comparative epoxy-coated glass material (left side) and an epoxy-coated nonwoven material of the present invention (right side). As shown in FIG. 2, both samples are folded to a 180° angle. As can be seen in FIG. 3, when the samples are unfolded, the epoxy-coated nonwoven material of the present invention remains intact while the comparative epoxy-coated glass material has cracked along the fold line. In at least one embodiment of the present invention, this strength and flexibility allows metal layers on both sides of the polymeric layer to be etched at the same time if desired. This enables a faster and more efficient manufacturing process.

Suitable nonwoven materials can be made of any material that can be formed into a long strand nonwoven material. In some embodiments a material that can be formed into a long strand, high temperature nonwoven material is preferred. Such materials include, but are not limited to liquid crystal polymer (LCP), which can form a high temperature nonwoven material. Suitable nonwoven materials can also be made with less temperature-resistant materials, or by combining LCP with the less temperature-resistant materials. Such materials include nylon, polyester, polystyrene, polyacrylonitrile, polypropylene, polyvinylidene fluoride (PVDF), and hybrid materials such as poly(ether sulfone)-polyvinylidene fluoride (PES-PVDF), polyetherimide-polyvinylidene fluoride (PEI-PVDF), polyacrylonitrile-polyvinylidene fluoride (PAN-PVDF), ethylene chlorotrifluoroethylene (ECTFE), and combinations thereof. In some embodiments, these less temperature-resistant materials may be mixed with the LCP in amounts up to about 20 to about 25 wt %. The nonwoven materials may be of any suitable long strand form such as, but not limited to, meltblown nonwovens, spunbond nonwovens, and electrospun nonwovens. Various additives may be added to the precursor material for the nonwoven materials to influence certain properties of the nonwoven material such as electrical properties, mechanical properties, chemical properties, and thermal properties.

In some embodiments, the precursor material used to make the nonwoven materials may contain a crosslinking agent so that the fibers in the nonwoven materials can be crosslinked after the nonwoven material is formed. Suitable crosslinking agents can be thermal, e-beam, and UV crosslinking agents and include, but are not limited to, triallylcyanurate and triallylisocyanurate. The crosslinking agent may be added in any suitable amount, typically about 2 to about 3 wt %. Crosslinking the nonwoven material can improve properties such as thermal stability, solvent resistance, and durability.

Although the nonwoven material itself may have a low thermal conductivity, because it has openings that allow the epoxy resin material (which can be loaded with conductive particles that may be thermally and/or electrically conductive) of the polymeric layer to form a continuous path from one surface of the polymeric layer to the other, in at least some embodiments, it does not decrease the thermal conductivity of the polymeric layer compared to an epoxy resin without the nonwoven material. Furthermore, instead of, or in addition to, loading the epoxy resin with conductive particles, in some embodiments of the present invention, the fibers in the nonwoven material may be loaded with conductive particles, i.e., conductive particles are embedded in the fibers of the nonwoven material, to increase the conductivity of the polymeric layer. The particles may be loaded in the molten material used to form the nonwoven fibers, but this is not preferred because it can produce weak fibers. The particles can be applied after the nonwoven material is formed, for example by solvent coating, powder coating, or sputter coating. Suitable conductive particles include the same particles, described above, that can be added to the epoxy resin composition. The nonwoven material can be loaded with an amount of conductive particles suitable to provide the desired properties for the polymeric layer. In at least one embodiment, the particles are loaded in an amount of up to about 30 wt % of the precursor material used to form the nonwoven material.

Other materials may be added to the precursor material used to form the nonwoven material to change other properties. For example, silicon dioxide may be added to change the mechanical properties of the nonwoven material.

It is preferable that the nonwoven material be thin, e.g., less than about 50 μm thick. In at least one embodiment, the nonwoven material is equal to or less than about 30 μm thick. In at least one embodiment, the nonwoven material is equal to or less than about 20 μm thick. In some embodiments the nonwoven material is about 10 to about 20 μm thick. In at least one embodiment of the present invention, the nonwoven material has a density less than about 7 g/m². In at least one embodiment of the present invention, the nonwoven material has a density less than about 3 g/m². In at least one embodiment of the present invention, the nonwoven material has a tensile strength of 10N or more in at least one direction, e.g., along the length or width of the material.

To provide a thinner nonwoven material, the nonwoven material may be etched. For example, an LCP nonwoven material may be etched in a similar manner as an LCP film by using a highly alkaline etching solution such as that described in U.S. Pat. No. 7,348,045. The highly alkaline etching solution comprises an alkali metal salt and optionally a solubilizer. A solution of an alkali metal salt alone may be used as an etching solution for polyimide but has a low etching rate when etching materials such as LCP. However, when a solubilizer is combined with the alkali metal salt etchant, it can be used to effectively etch polyimide copolymers having carboxylic ester units in the polymeric backbone and LCPs.

Water soluble salts suitable for use in the etching solution include, for example, potassium hydroxide (KOH), sodium hydroxide (NaOH), substituted ammonium hydroxides, such as tetramethylammonium hydroxide and ammonium hydroxide or mixtures thereof. Useful alkaline etching solutions include aqueous solutions of alkali metal salts including alkali metal hydroxides, particularly potassium hydroxide, and their mixtures with amines, as described in U.S. Pat. Nos. 6,611,046 B1 and 6,403,211 B1. Useful concentrations of the etching solutions vary depending upon the thickness of the film to be etched. Typical useful concentrations of a suitable salt range for etching LCP have a lower range of about 30 wt. % to 40 wt. % and an upper range of about 50 wt. % to about 55 wt. %. Typical useful concentrations of a suitable solubilizer have a lower range of about 10 wt. % to about 15 wt. % and an upper range of about 30 wt. % to about 35 wt. %. The use of KOH with a solubilizer is preferred for producing a highly alkaline solution because KOH-containing etching solutions have higher etching rates. The etching solution is generally at a temperature of from about 50° C. (122° F.) to about 120° C. (248° F.) preferably from about 70° C. (160° F.) to about 95° C. (200° F.) during etching.

Typically the solubilizer in the etching solution is an amine compound, preferably an alkanolamine. Solubilizers for etching solutions according to the present invention may be selected from the group consisting of amines, including ethylene diamine, propylene diamine, ethylamine, methylethylamine, and alkanolamines such as ethanolamine, diethanolamine, propanolamine, and the like. The etching solution, including the amine solubilizer, works most effectively within the above-referenced percentage ranges. This suggests that there may be a dual mechanism at work for etching liquid crystal polymers, i.e., the amine acts as a solubilizer for the liquid crystal polymers most effectively within a limited range of concentrations of alkali metal salt in aqueous solution.

In at least one embodiment, nonwoven materials are made thin by using nanofibers to form the nonwoven material, i.e., the fibers in the nonwoven material have diameters in the nanometer range, i.e., less that one micrometer, and typically from about 20 to about 500 nanometers. The nanofiber nonwoven materials can be made using the same materials that are used to form other nonwoven materials. In at least one embodiment, because they are so small, using the nanofibers allows for a thin nonwoven material having multiple layers of fiber in contrast to a nonwoven material of the same thickness having larger diameter fibers. In some embodiments, the nanofibers can provide a more uniform and/or denser matrix of fibers. Nanofibers and nanofiber nonwoven materials may be made by any suitable method, typically electrospinning. Nanofibers, nanofiber webs or materials, and electrospinning are described in more detail in "Polymeric Nanofibers and Nanofiber Webs: A New Class of Nonwovens," Timothy Grafe, et al., presented at *INTC 2002: International Nonwovens Technical Conference (Joint INDA-TAPPI Conference)*, Atlanta, Ga., Sep. 24-26, 2002.

One method for manufacturing an article of the present invention includes first providing a suitable nonwoven material and coating it with an epoxy resin composition such that the nonwoven material is embedded in the cured epoxy material. The epoxy layer may be thin enough such that portions of the nonwoven material are exposed at the surface of the cured epoxy composition, but in at least some embodiments of the present invention the epoxy resin composition completely covers the nonwoven material. It is desirable to have the epoxy resin composition fill all the voids/interstices within the nonwoven material. Accordingly, providing a relatively precise application of the composition such as with a slot die, maintaining the composition at a suitable viscosity, controlling the line speed and drying speed, and using nip rollers or other device to press the epoxy resin composition into the voids of the nonwoven material is often preferred. The resulting article is preferably a self-supporting sheet. The epoxy may be partially or fully cured after its application. With this method, the nonwoven material/layer need not be independently self-supporting, so long as the epoxy-coated nonwoven material is self-supporting. The nonwoven material may be formed on, or supported by, a sheet or film then coated with a epoxy resin material.

Subsequent to formation of the self-supporting epoxy-coated nonwoven polymeric material, a metal-clad article of the invention can be made using a roll-to-roll process by feeding the epoxy-coated nonwoven material between first and second metal layers in a lamination process. The metal layers may, or may not be, separately coated with epoxy resin. The resulting laminate may then be heated for a time and at a temperature sufficient to cure the epoxy resin composition.

Another method for manufacturing a metal-clad article of the invention includes providing first and second metal layers, each having two opposing major surfaces. The metal layer may be any suitable material such as copper or aluminum. An epoxy resin composition may then be coated onto a first major surface of each of the metal layers. The two metal layers may then be laminated together with their epoxy resin-coated sides facing each other and with a nonwoven layer between the epoxy-coated major surfaces of the metal layers. If this method of manufacturing is conducted in a roll-to-roll process, the nonwoven layer typically needs to be a self-supporting at the outset for it to withstand the tension applied during the lamination process. As the layers are laminated together, the epoxy resin fills the voids in the nonwoven material so that the epoxy resin and nonwoven material essentially form a single layer. The amount of epoxy resin coated on the metal layer surfaces, the lamination pressure, and the thickness of the nonwoven material may be controlled such that the nonwoven material contacts, or does not contact, the first major surface of one or both of the metal layers. The resulting laminate may then be heated for a time and a temperature sufficient to cure the epoxy resin composition.

When making a metal-clad article, adhesion of the polymeric layer to a metal layer may be enhanced if the metal is sufficiently soft at the time it is contacted with the epoxy resin composition or becomes soft during lamination and/or cure; i.e., the foil is annealed before it contacts the epoxy resin composition or becomes annealed during subsequent processing. Annealing may be accomplished by heating the metal layer before the coating step or as a result of the curing or drying step if the metal anneal temperature is at or lower than the cure temperature of the epoxy resin composition. It is preferred to use a metal layer with an anneal temperature below the temperature at which curing occurs. Annealing condition will vary depending on the metal layer used. Typically, in the case of copper, at either of these stages in the process, the metal layer obtains a Vickers hardness, using a 10 g load, of less than about 75 kg/mm$^2$. A typical temperature range of copper to achieve this hardness ranges from about 100 to about 180° C., more typically about 120 to about 160° C.

In at least one embodiment, the thickness of the final article, which may comprise only an epoxy-coated nonwoven polymeric layer, is less than about 50 µm. In at least one embodiment, the thickness is less than about 30 µm. In at least one embodiment, the thickness is less than about 20 µm. In at least one embodiment, the thickness is about 15 to about 80 µm. In at least one embodiment, the thickness is about 15 to about 60 µm. In at least one embodiment, the thickness is about 15 to about 35 µm.

In at least one embodiment, the thickness of the final article, which may comprise an epoxy-coated nonwoven polymeric layer between two conductive layers is less than about 50 µm. In at least one embodiment, the thickness is about 15 to about 80 µm. In at least one embodiment, the thickness is about 15 to about 60 µm. In at least one embodiment, the thickness is about 15 to about 35 µm.

Although a metal-clad article of the present invention can be functional as it is fabricated, the article may be patterned, for example, to form discrete islands or removed regions of material, for example to provide contact pads for LEDs. Any suitable patterning technique known in the art may be employed. The patterned article may be used as a circuit article itself or as a component in a circuit article. The term "electrically conductive traces" refers to strips or patterns of a conductive material designed to carry current. Suitable materials for an electrically conductive trace comprise copper, aluminum, tin, solder, silver paste, gold, and combinations thereof.

Embodiments of a metal-clad article of the present invention may further comprise one or more additional layers, for example, a thermal interface material (TIM) or heat sink. The TIM may comprise an adhesive that attaches a heat sink, such as a copper or aluminum foil or rigid substrate to the article.

Embodiments of an article of the present invention may include additional layers to prepare it for use in a printed circuit board (PCB) or flexible circuit. The additional layer may be rigid or flexible. Exemplary rigid layers include fiberglass/epoxy composite commercially available from Polyclad, Franklin, N.H., under the trade designation PCL-FR-226, ceramic, metal, or combinations thereof. Exemplary flexible layers comprise a epoxy resin film such as polyimide or polyester, metal foils, or combinations thereof. Polyimide is commercially available from DuPont under the trade designation KAPTON and polyester is commercially available from 3M Company, St. Paul, Minn., under the trade designation SCOTCHPAR. These additional layers may also contain electrically conductive traces on top of the layer or embedded within the layer.

Embodiments of the present invention also include an electrical device, comprising an article of the present invention, functioning in an electrical circuit of a PCB or a flexible circuit. Exemplary electrical devices include cell phones, telephones, fax machines, computers, printers, pagers, and other devices as recognized by one skilled in the art.

Embodiments of the present invention also include an assembly in which an uncured article of the present invention is placed between a structure, such as a metal frame, and a device, such as an electronic device, and subsequently cured to both adhere the device to the structure and provide a grounding path for the device.

EXAMPLES

This invention is illustrated by the following examples, but the particular materials and amounts thereof recited in these examples, as well as other conditions and details should not be construed to unduly limit this invention.

Materials

Epoxy: EPON 1001F; EPON 1050, Shell Chemical Company, Houston, Tex.
4-Aminophenyl sulfone (DDS): 97% purity, Sigma-Aldrich
Aluminum nitride (AlN): Particle size: 1 µm, Tokuyama America, Inc.
Boron Nitride (BN): Particle size: 1 µm, Sigma-Aldrich
Solvent: Methylethylketone (MEK)
LCP (liquid crystal polymer) nonwoven material: MBBK6CZSO, Basis weight: 6 g/m² (gsm), Kuraray America, Inc.
Glass fiber nonwoven material: Basis weight: 4.5 g/m² (gsm), Technical Fibre Products, Newburgh, N.Y.
Aramid-PET (polyethylene terephthalate) nonwoven material: Basis weight: 12 g/m² (gsm), Electrical Markets Division, 3M Company, St. Paul, Minn.
Copper foil: 35 µm thick (1 oz) electrodeposited (ED) copper foil, Oak Mitsui, Camden, S.C.
PET (polyethylene terephthalate) liner: Thickness: 25.4 µm (1 mil), Mitsubishi Polyester Film, Greer, S.C.
Carbon black: ENSACO 250G Conductive Carbon Black powder, TIMCAL Ltd., Bodio, Switzerland
Silver coated glass beads: TP12S16 (12 µm diam.) (development stage product), Potters Industries LLC, Malvern, Pa.
Dispersant: SOLSPERSE 76500, a solution of 50% active polymeric dispersant in n-butyl acetate, Lubrizol Ltd., Blackley, Manchester, UK Equipment Mixing: SpeedMixer DAC 150FVZ, FlackTek, Inc., Landrum, S.C.
Laminating: Standard nip roller laminator
Curing: Standard oven
Thermal conductivity testing: Modified ASTM D5470-06 heat flow meter: The hot and cold meter bars, 2 inches in diameter and approximately 3 inches long, are instrumented with six evenly-spaced thermocouples, the first of which is 5.0 mm away from the interface between the bars. The bars are constructed from brass, with a reference thermal conductivity of 130 W/m·K. The contacting faces of the meter bars are parallel to within about 5 µm, and the force on the sample during testing is approximately 120 N. The thickness of the sample is measured during testing by a digital displacement transducer with a nominal accuracy of 2 µm.
Electrical resistance testing: QuadTech 7600 Plus LCR meter with LD3 test fixture and electrical cables, QuadTech, Inc., Marlborough, Mass., measurement range 000.0001 m ohms to 99.99999 M ohms.

Thermal Conductivity Testing

Prior to testing each sample, the meter bars were placed in contact with an interfacial fluid (water) to eliminate thermal contact resistance. When the meter bars reached equilibrium, the digital displacement transducer was zeroed, and the sample placed between the open meter bars. A small amount of interfacial fluid was placed on each side of the sample to eliminate thermal contact resistance. The meter bars were closed and the normal force was applied. Measurements of the heat flow through the meter bars, and the thickness of the sample were made throughout the duration of the test, typically about 30 minutes. Equilibrium was generally reached within about 10 minutes.

The thermal conductivity of each sample $k_{sample}$ was calculated from the thickness of the sample (L), the thermal conductivity of the meter bars ($k_{meter}$), the temperature gradient in the meter bars ($d_T/d_X$), and the extrapolated temperature difference across the sample ($T_u-T_l$) using the following formula:

$$k_{sample} = \frac{k_{meter} * \left(\frac{d_T}{d_X}\right)}{(T_u - T_l)/L}$$

Electrical Resistance Testing

The selection resistance measurement Rp was selected on the LCR meter. This selection provides a read-out of the electrical resistance value. The frequency was selected at 1000 Hz on the LCR meter. The sample was placed in the test fixture. The electrical resistance value was read out. If desired, this electrical resistance value can be used to calculate the resistivity ρ of the sample material using the following formula:

$$\rho = Rp * A/t$$

where Rp is the electrical resistance of the sample (measured in ohms), A is the effective area of the sample (measured in cm²), and t is the spacing between the electrodes of the test fixture (measured in cm).

Example 1

Step 1: For each of the four samples, predetermined quantities of materials were added to a beaker according to Table 1.

TABLE 1

| Material | Sample 1a | Sample 1b | Sample 1c | Sample 1d |
|---|---|---|---|---|
| MEK | 80 g | 80 g | 80 g | 80 g |
| EPON 1001F | 32 g | 32 g | 32 g | 32 g |
| EPON 1050 | 8 g | 8 g | 8 g | 8 g |
| DDS | 6.5 g | 6.5 g | 6.5 g | 6.5 g |
| BN | 9 g | 24 g | 32 g | 0 g |

Step 2: Using the high speed mixer, the materials were mixed for 10 minutes, resulting in a uniformly distributed coating solution.

Step 3: The LCP (liquid crystal polymer) nonwoven material (web) was placed against the PET (polyethylene terephthalate) liner, and the coating solution was coated into the nonwoven material, whereby the liner served as a stop for the coating solution. The coated nonwoven material was air dried overnight, resulting in a dry film having a thickness of 50 µm after removal of the liner.

Step 4: The 50 µm thick dry film was laminated between two copper foils using the nip roller laminator at a temperature of 163° C. at a line speed of 0.9 meters per minute.

Step 5: The laminated structure was cured using the oven at 190° C. for 4 hours in air to form the two-metal layer laminate.

Step 6: The four samples of the two-metal layer laminate were each submitted to thermal conductivity testing as described above under Thermal Conductivity Testing. The results are provided in Table 2.

TABLE 2

| | Sample 1a | Sample 1b | Sample 1c | Sample 1d |
|---|---|---|---|---|
| Thermal Conductivity [W/m · K] | 0.54 | 0.66 | 0.78 | 0.30 |

Example 2

Step 1: For each of the four samples, predetermined quantities of materials were added to a beaker according to Table 3.

TABLE 3

| Material | Sample 2a | Sample 2b | Sample 2c | Sample 2d |
| --- | --- | --- | --- | --- |
| MEK | 80 g | 80 g | 80 g | 80 g |
| EPON 1001F | 32 g | 32 g | 32 g | 32 g |
| EPON 1050 | 8 g | 8 g | 8 g | 8 g |
| DDS | 6.5 g | 6.5 g | 6.5 g | 6.5 g |
| AlN | 48 g | 57 g | 70 g | 100 g |

Step 2: Using the high speed mixer, the materials were mixed for 10 minutes, resulting in a uniformly distributed coating solution.

Step 3: The LCP (liquid crystal polymer) nonwoven material (web) was placed against the PET (polyethylene terephthalate) liner, and the coating solution was coated into the nonwoven material, whereby the liner served as a stop for the coating solution. The coated nonwoven material was air dried overnight, resulting in a dry film having a thickness of 50 μm after removal of the liner.

Step 4: The 50 μm thick dry film was laminated between two copper foils using the nip roller laminator at a temperature of 163° C. at a line speed of 0.9 meters per minute.

Step 5: The laminated structure was cured using the oven at 190° C. for 4 hours in air to form the two-metal layer laminate.

Step 6: The four samples of the two-metal layer laminate were each submitted to thermal conductivity testing as described above under Thermal Conductivity Testing. The results are provided in Table 4.

TABLE 4

| | Sample 2a | Sample 2b | Sample 2c | Sample 2d |
| --- | --- | --- | --- | --- |
| Thermal Conductivity [W/m · K] | 0.76 | 0.88 | 0.96 | 1.53 |

Example 3

Step 1: For each of the four samples, predetermined quantities of materials were added to a beaker according to Table 5.

TABLE 5

| Material | Sample 3a | Sample 3b | Sample 3c | Sample 3d |
| --- | --- | --- | --- | --- |
| MEK | 80 g | 80 g | 80 g | 80 g |
| EPON 1001F | 32 g | 32 g | 32 g | 32 g |
| EPON 1050 | 8 g | 8 g | 8 g | 8 g |
| DDS | 6.5 g | 6.5 g | 6.5 g | 6.5 g |
| AlN | 18 g | 25 g | 32 g | 41 g |
| BN | 18 g | 11 g | 14 g | 14 g |

Step 2: Using the high speed mixer, the materials were mixed for 10 minutes, resulting in a uniformly distributed coating solution.

Step 3: The LCP (liquid crystal polymer) nonwoven material (web) was placed against the PET (polyethylene terephthalate) liner, and the coating solution was coated into the nonwoven material, whereby the liner served as a stop for the coating solution. The coated nonwoven material was air dried overnight, resulting in a dry film having a thickness of 50 μm after removal of the liner.

Step 4: The 50 μm thick dry film was laminated between two copper foils using the nip roller laminator at a temperature of 163° C. at a line speed of 0.9 meters per minute.

Step 5: The laminated structure was cured using the oven at 190° C. for 4 hours in air to form the two-metal layer laminate.

Step 6: The four samples of the two-metal layer laminate were each submitted to thermal conductivity testing as described above under Thermal Conductivity Testing. The results are provided in Table 6.

TABLE 6

| | Sample 3a | Sample 3b | Sample 3c | Sample 3d |
| --- | --- | --- | --- | --- |
| Thermal Conductivity [W/m · K] | 0.73 | 0.78 | 0.78 | 0.78 |

Example 4

Step 1: Predetermined quantities of materials were added to a beaker according to Table 7.

TABLE 7

| Material | Sample 4 |
| --- | --- |
| MEK | 80 g |
| EPON 1001F | 32 g |
| EPON 1050 | 8 g |
| DDS | 6.5 g |
| AlN | 100 g |

Step 2: Using the high speed mixer, the materials were mixed for 10 minutes, resulting in a uniformly distributed coating solution.

Step 3: The glass fiber nonwoven material (web) was placed against the PET (polyethylene terephthalate) liner, and the coating solution was coated into the nonwoven material, whereby the liner served as a stop for the coating solution. The coated nonwoven material was air dried overnight, resulting in a dry film having a thickness of 70 μm after removal of the liner.

Step 4: The 70 μm thick dry film was laminated between two copper foils using the nip roller laminator at a temperature of 163° C. at a line speed of 0.9 meters per minute.

Step 5: The laminated structure was cured using the oven at 190° C. for 4 hours in air to form the two-metal layer laminate.

Step 6: The sample of the two-metal layer laminate was submitted to thermal conductivity testing as described above under Thermal Conductivity Testing. The results are provided in Table 8.

TABLE 8

| | Sample 4 |
| --- | --- |
| Thermal Conductivity [W/m · K] | 1.66 |

Example 5

Step 1: Predetermined quantities of materials were added to a beaker according to Table 9.

TABLE 9

| Material | Sample 5 |
| --- | --- |
| MEK | 80 g |
| EPON 1001F | 32 g |
| EPON 1050 | 8 g |
| DDS | 6.5 g |
| AlN | 100 g |

Step 2: Using the high speed mixer, the materials were mixed for 10 minutes, resulting in a uniformly distributed coating solution.

Step 3: The aramid-PET (polyethylene terephthalate) nonwoven material (web) was placed against the PET (polyethylene terephthalate) liner, and the coating solution was coated into the nonwoven material, whereby the liner served as a stop for the coating solution. The coated nonwoven material was air dried overnight, resulting in a dry film having a thickness of 70 μm after removal of the liner.

Step 4: The 70 μm thick dry film was laminated between two copper foils using the nip roller laminator at a temperature of 163° C. at a line speed of 0.9 meters per minute.

Step 5: The laminated structure was cured using the oven at 190° C. for 4 hours in air to form the two-metal layer laminate.

Step 6: The sample of the two-metal layer laminate was submitted to thermal conductivity testing as described above under Thermal Conductivity Testing. The results are provided in Table 10.

TABLE 10

| | Sample 5 |
| --- | --- |
| Thermal Conductivity [W/m · K] | 1.00 |

Example 6

Step 1: Predetermined quantities of materials were added to a beaker according to Table 11.

TABLE 11

| Material | Sample 6 |
| --- | --- |
| EPON 1001F | 12.7 g |
| EPON 1540 | 3.17 g |
| MEK | 27.8 g |
| SOLSPERSE 76500 | 1.8 g |
| DDS | 2.6 g |
| ENSACO 250G | 6.2 g |

Step 2: Using the high speed mixer at a speed of 33000 RPM, the materials were mixed for 5 minutes, resulting in a uniformly distributed coating solution.

Step 3: The LCP (liquid crystal polymer) nonwoven material (web) was placed against the PET (polyethylene terephthalate) liner, and the coating solution was coated into the nonwoven material, whereby the liner served as a stop for the coating solution. The coated nonwoven material was dried in the oven at 80° C. for 30 minutes, resulting in a dry film having a thickness of 50 μm after removal of the liner.

Step 4: The 50 μm thick dry film was laminated between two copper foils using the nip roller laminator at a temperature of 149° C. (300° F.) and a pressure of 689 kPa (100 PSI).

Step 5: The laminated structure was cured using the oven at 190° C. for 2 hours in air to form the two-metal layer laminate.

Step 6: The sample of the two-metal layer laminate was submitted to thermal conductivity testing and electrical resistance testing as described above under Thermal Conductivity Testing and Electrical Resistance Testing, respectively. The results are provided in Table 12.

TABLE 12

| | Sample 6 |
| --- | --- |
| Thermal Conductivity [W/m · K] | 0.6 |
| Electrical Resistance [ohms] | 100 |

Example 7

Step 1: Predetermined quantities of materials were added to a beaker according to Table 13.

TABLE 13

| Material | Sample 7 |
| --- | --- |
| EPON 1001F | 12.7 g |
| EPON 1540 | 3.17 g |
| MEK | 27.8 g |
| SOLSPERSE 76500 | 1.8 g |
| DDS | 2.6 g |
| ENSACO 250G | 3 g |
| TP12S16 | 20 g |

Step 2: Using the high speed mixer at a speed of 33000 RPM, the materials were mixed for 5 minutes, resulting in a uniformly distributed coating solution.

Step 3: The LCP (liquid crystal polymer) nonwoven material (web) was placed against the PET (polyethylene terephthalate) liner, and the coating solution was coated into the nonwoven material, whereby the liner served as a stop for the coating solution. The coated nonwoven material was dried in the oven at 80° C. for 30 minutes, resulting in a dry film having a thickness of 50 μm after removal of the liner.

Step 4: The 50 μm thick dry film was laminated between two copper foils using the nip roller laminator at a temperature of 149° C. (300° F.) and a pressure of 689 kPa (100 PSI).

Step 5: The laminated structure was cured using the oven at 190° C. for 2 hours in air to form the two-metal layer laminate.

Step 6: The sample of the two-metal layer laminate was submitted to thermal conductivity testing and electrical resistance testing as described above under Thermal Conductivity Testing and Electrical Resistance Testing, respectively. The results are provided in Table 14.

TABLE 14

| | Sample 7 |
| --- | --- |
| Thermal Conductivity [W/m · K] | 0.8 |
| Electrical Resistance [ohms] | 0.6 |

Various modifications and alterations of this invention will become apparent to those skilled in the art without departing from the scope and spirit of this invention and it should be understood that this invention is not to be unduly limited to the illustrative embodiments set forth herein.

What is claimed is:
1. An article comprising:
a flexible thermally conductive polymeric layer comprising an epoxy resin and a long-strand polymeric non- woven material embedded in the epoxy resin, wherein the polymeric nonwoven material is heat stable at about 280° C., and wherein the polymeric nonwoven material is a chemically etched polymeric nonwoven material having a density less than about 7 g/m².

2. The article of claim 1 being free standing.

3. The article of claim 1 having a thickness of less than about 50 μm.

4. The article of claim 1 having a thickness of about 15 to about 35 μm.

5. The article of claim 1 wherein the epoxy resin is loaded with one or both of thermally and electrically conductive particles.

6. The article of claim 5 wherein the thermally conductive particles have a thermal conductivity greater than 10 W/m·K.

7. The article of claim 5 wherein the particles have a maximum dimension of about 0.5 to about 20 μm.

8. The article of claim 5 wherein the particles comprise up to about 75 wt % of the epoxy component.

9. The article of claim 1 wherein the nonwoven material is equal to or less than about 50 μm thick.

10. The article of claim 1 wherein the nonwoven material is equal to or less than about 30 μm thick.

11. The article of claim 1 wherein the nonwoven material is equal to or less than about 20 μm thick.

12. The article of claim 1 wherein the nonwoven material is about 10 micrometers to about 20 micrometers thick.

13. The article of claim 1 wherein the nonwoven material is selected from the group consisting of meltblown nonwovens, spunbond nonwovens, and electrospun nonwovens.

14. The article of claim 1 wherein the nonwoven material has a density less than about 3 g/m².

15. The article of claim 1 further comprising an electrically conductive layer on one or both sides of the polymeric layer.

16. The article of claim 15 wherein the conductive layers are selected from the group consisting of copper, aluminum and alloys thereof.

17. The article of claim 1 wherein the nonwoven material has a tensile strength of 10N or more in one direction.

18. The article of claim 1 which can be folded to 180° forming a fold line and unfolded without cracking.

19. A method of making an article comprising a flexible thermally conductive layer, the method comprising:
   providing a long-strand nonwoven material, the long-strand nonwoven material being heat stable at about 280° C.;
   chemically etching the long-strand nonwoven material in order to reduce a density of the long-strand nonwoven material and to thereby form an etched polymeric nonwoven material, the etched polymeric nonwoven material having a density less than about 7 g/m²;
   embedding the etched polymeric nonwoven material in an epoxy resin; and
   curing the epoxy resin to form the thermally conductive layer.

20. The method of claim 19, wherein the providing a long-strand nonwoven material step comprises:
   forming a non-crosslinked nonwoven material; and
   crosslinking the non-crosslinked nonwoven material to form the long-strand nonwoven material.

* * * * *